(12) United States Patent
Tsai et al.

(10) Patent No.: US 11,432,447 B2
(45) Date of Patent: Aug. 30, 2022

(54) INFORMATION HANDLING SYSTEM INTERCHANGEABLE SOLDER PADS

(71) Applicant: Dell Products L.P., Round Rock, TX (US)

(72) Inventors: Yu-Lin Tsai, New Taipei (TW); Chia-Hsien Lu, Taoyuan (TW); Chun-Min He, Taipei (TW); RungLung Lin, Taipei (TW); Chin-Chung Wu, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 548 days.

(21) Appl. No.: 16/432,451

(22) Filed: Jun. 5, 2019

(65) Prior Publication Data

US 2020/0390012 A1 Dec. 10, 2020

(51) Int. Cl.
   *H05K 13/04* (2006.01)
   *H05K 3/30* (2006.01)
   *H05K 1/18* (2006.01)

(52) U.S. Cl.
   CPC ......... *H05K 13/0465* (2013.01); *H05K 1/181* (2013.01); *H05K 3/303* (2013.01); *H05K 2201/10689* (2013.01)

(58) Field of Classification Search
   CPC .... H05K 13/0465; H05K 1/181; H05K 3/303; H05K 2201/10015; H05K 2201/10636; H05K 2203/048; Y10T 29/4913; Y10T 29/49144
   USPC ................................... 29/832, 840
   See application file for complete search history.

(56) References Cited

U.S. PATENT DOCUMENTS

| | | | |
|---|---|---|---|
| 5,683,788 A * | 11/1997 | Dugan | H05K 1/111 174/263 |
| 6,977,440 B2 | 12/2005 | Pflughaupt | |
| 7,872,874 B2 * | 1/2011 | Karasawa | H05K 3/3442 361/767 |
| 9,277,648 B2 * | 3/2016 | Hamao | H05K 3/3452 |
| 9,961,770 B2 | 5/2018 | Dummer | |
| 2008/0079143 A1 | 4/2008 | Boucher et al. | |

* cited by examiner

*Primary Examiner* — Donghai D Nguyen
(74) *Attorney, Agent, or Firm* — Zagorin Cave LLP; Robert W. Holland

(57) ABSTRACT

An information handling system printed circuit board includes solder pads that accept footprint compatible integrated circuits, such as charger integrated circuits that provide power with different choke circuit supporting components. Solder pads for supporting components include first and second conductive areas sized to accept a first supporting component, each of the first and second conductive areas including an intervening non-conductive area that manages positioning of a smaller second supporting component at solder reflow.

9 Claims, 4 Drawing Sheets

INFORMATION HANDLING SYSTEM INTERCHANGEABLE SOLDER PADS

BACKGROUND OF THE INVENTION

Field of the Invention

The present invention relates in general to the field of information handling system circuit boards, and more particularly to an information handling system interchangeable solder pads.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems generally process information with processing components that communicate through a circuit board. A typical information handling system circuit board has printed wirelines and solder pads embedded in a hard plastic material as a structure generally referred to as a printed circuit board (PCB). During manufacture, processing components are placed on the circuit boards with surface mount technology (SMT), such as with a pick-and-place machine. The processing components are coupled to the circuit board with a solder paste and then heated to bind the processing components to the circuit board at the solder pads. Once the processing components are soldered to the solder pads, wirelines embedded in the PCB interconnect the processing components. Generally PCBs that include a central processing unit (CPU) are called motherboards while other PCBs within an information handling system are called daughterboards. In some instances, processing components will themselves include a PCB, such as a PCB within a storage device or a system on module (SOM) that mounts a PCB onto another PCB.

Information handling systems often have complex circuit boards that include a number of supporting electrical components. For example, resistors, capacitors and inductors are often included to help maintain desired voltage and current supplied to processing components. For instance, a CPU typically needs a constant voltage to operate at divergent current values that can rapidly change as processing tasks ebb and wane. As another example, communication links often include resistors, capacitors and inductors to maintain signal strength relative to a ground plane. Size constraints for a circuit board, such as often exist for portable information handling systems, can result in tight positioning of components.

One difficulty with conventional printed circuit boards is that a new design with new wirelines is typically used in each new platform. Generally a new design is needed because processing components have different electrical characteristics that use different resistors, capacitors and inductors to balance voltage, current and ground interactions. Each printed circuit board design tends to have a number of similar administrative expenses that add development overhead to the cost of the circuit board. For instance, each new design is typically prototyped in small volumes and tested before production. Further each new design typically has to meet regulatory requirements that add to costs, such as noise emission limitations.

SUMMARY OF THE INVENTION

Therefore, a need has arisen for a system and method which provides information handling system circuit boards with interchangeable solder pads.

In accordance with the present invention, a system and method are provided which substantially reduce the disadvantages and problems associated with previous methods and systems for placing components on an information handling system circuit board. First and second components of different sizes both fit on a common solder pad conductive area that includes an intervening non-conductive area to maintain the smaller component position during solder reflow.

More specifically, an information handling system processes information with components disposed on a circuit board having plural solder pads interfaced by wirelines. At least some of the components are selected from multiple component models that have matching conductive footprints, such as multiple charger integrated circuit components available with matching footprints but different charging characteristics and different chokes provided by different supporting components. Supporting component solder pads are formed with a geometry that accommodates plural types of supporting components having different sizes so that a common printed circuit board will support multiple integrated circuits having a common footprint but supported by supporting components of different footprints. For example, a conductive area of a solder pad sized to fit under a first supporting component conductive area includes an intervening non-conductive area that aligns under the first supporting conductive area. When a second supporting component having a smaller conductive area is used instead of the first supporting component, the intervening non-conductive area defines a perimeter for placement of the second supporting component that holds the second supporting component in place during solder reflow.

The present invention provides a number of important technical advantages. One example of an important technical advantage is that a printed circuit board adapts to multiple surface mounted devices by including interchangeable solder pads to couple different types of surface mounted devices to a circuit board. For instance, surface pad geometry defines a separation that manages reflow soldering where multiple types of surface mounted devices each have different footprints. In one example embodiment, pin-to-pin compatible integrated circuit chargers, the ISL95522 and ISL9538, each have different choke sizes to support different power demands. A PCB supports both charger integrated circuits by sharing interchangeable solder pads for the different chokes, such as adapting a 0404 MLCC capacitor to accept one or two 0201 MLCC capacitors. In addition to supporting both chargers, the PCB interchangeable solder pads allow the use of two 0202 MLCC capacitors instead of one 0402 MLCC capacitors in the event of a parts shortage. Multi-purpose PCB solder pads reduce design and manufacture costs without negatively impacting manufacture complexity where solder reflow management results from solder pad shape adjustments.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system circuit board adapts to multiple supporting components of different sizes on common solder pads by disrupting a conductive area defined by a larger supporting component with intervening nonconductive areas that anchor smaller components during solder reflow. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
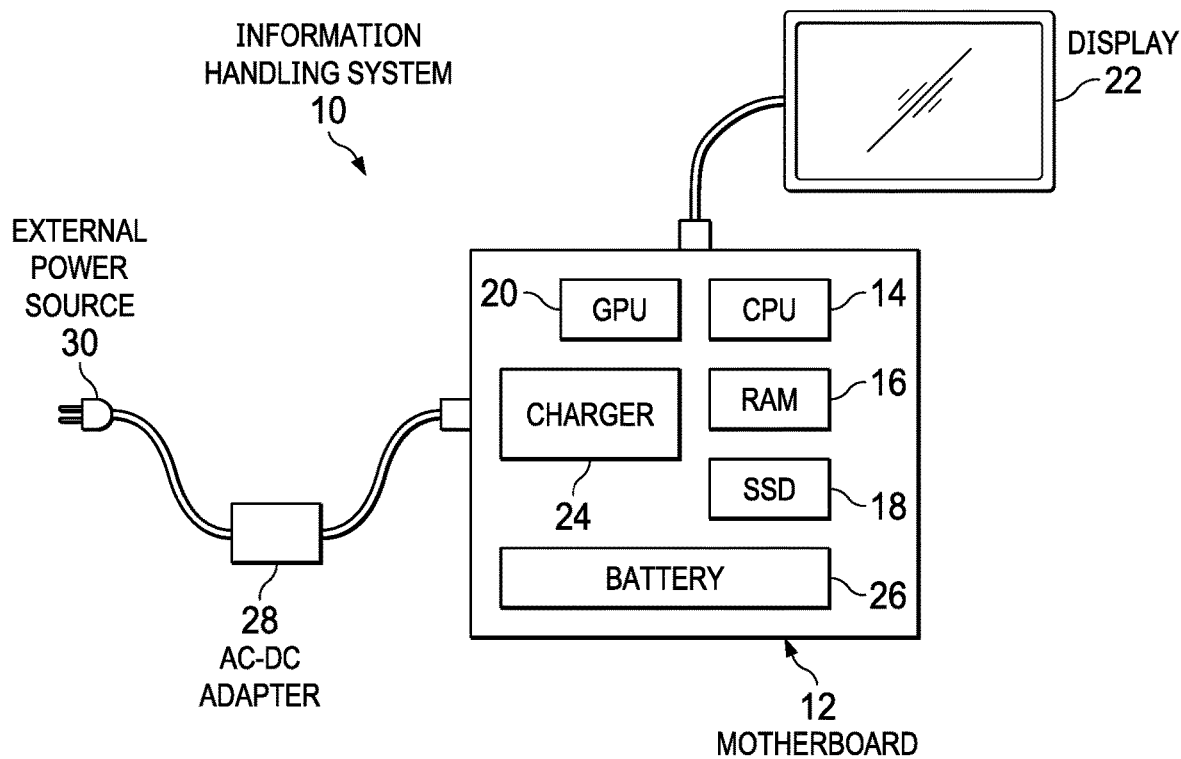
FIG. 1 depicts a block diagram of an information handling system having a charger integrated circuit selected from multiple models that operate with different supporting components.

Referring now to FIG. 1, a block diagram depicts an information handling system 10 having a charger integrated circuit 24 selected from multiple models that operate with different supporting components. Information handling system 10 processes information with processing components disposed on a motherboard 12, such as a printed circuit board (PCB) that interfaces components through integrated wirelines. In the example embodiment, information handling system 10 processes information with instructions executed on a central processing unit (CPU) 14 and stored in random access memory (RAM) 16. For instance, an operating system and applications are retrieved from persistent storage of a solid state drive (SSD) 18 to present output as visual images through a graphics processing unit (GPU) 20 at a display 22. In the example embodiment, a portable configuration is depicted with a charger 24 providing power to the processing components from an integrated battery 26 and/or an external AC-DC-power adapter 28 interfaced with an external power source 30.

In the example embodiment, charger 24 is an integrated circuit coupled by plural solder pads to motherboard 12 and selected from a variety of models to meet anticipated power consumption and battery charging constraints. For instance, charger integrated circuit 24 may be an ISL95522 or ISL9538 charger integrated circuit, each of which has a different size "choke" to manage power demand, such as different types of capacitors and inductors that also couple to motherboard 12. In alternative embodiments, footprint compatible integrated circuits might include a variety of different functions, such as for an embedded controller, communication graphics or other functions. Integrated circuits may be surface mounted or mounted by other techniques, such as through mounted or coupled to a socket.

Figure 2:
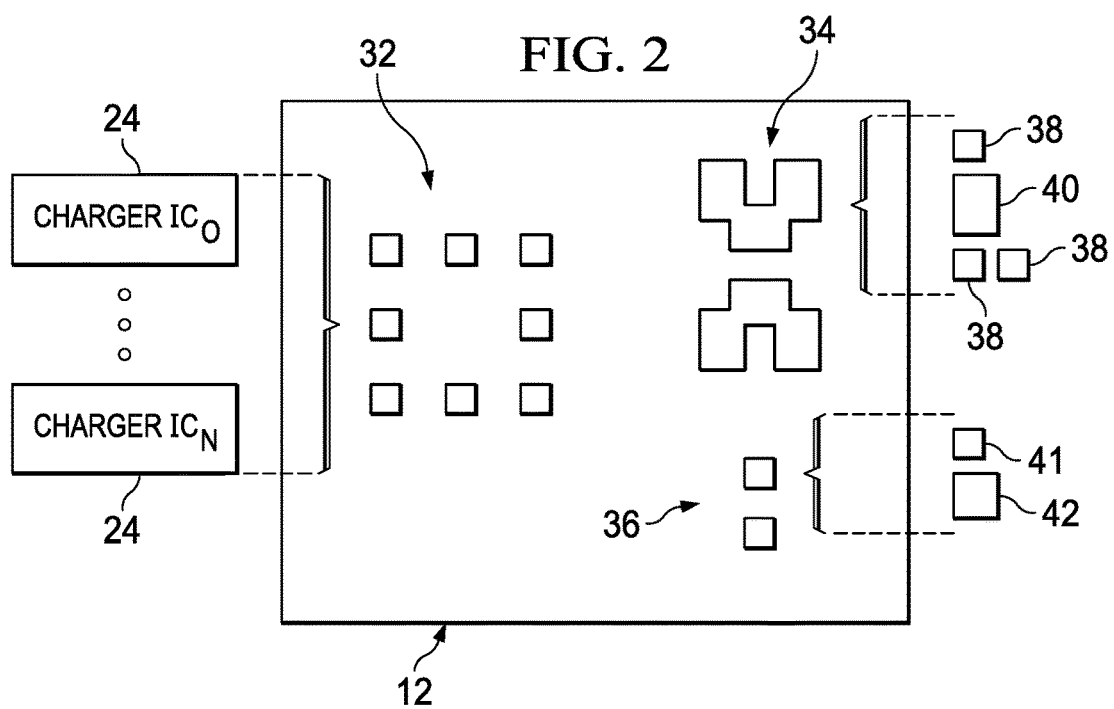
FIG. 2 depicts a top view of a printed circuit board illustrating one example of different types of supporting components that may couple to a printed circuit board based upon the type of integrated circuit chosen for inclusion on the printed circuit board.

Referring now to FIG. 2, a top view of a printed circuit board 12 depicts one example of different types of supporting components that may couple to a printed circuit board based upon the type of charger integrated circuit 24 chosen for inclusion on the printed circuit board. Any number of different types of charger integrated circuits 24 each couple to integrated circuit solder pads 32 to manage power at printed circuit board 12, with each type of charger integrated circuit 24 providing different voltage and current constraints. Each type of charger integrated circuit 24 has a different "choke" circuit that, in the example embodiment, includes one or more capacitors and inductors of different values of capacitance and inductance. A capacitor solder pad 34 has opposing conductive pads to accept plural types of capacitors and inductor solder pad 36 has opposing conductive pads to accept plural types of inductors. In the example embodiment, depending on the type of charger integrated circuit, capacitor solder pads 34 may couple to a single 0201 capacitor, a single 0402 capacitor or two 0201 capacitors. Similarly, inductor solder pads 36 may couple to a single 7×7 mm inductor or a single 10×10 inductor. The depicted component solder pads are presented as an example and, in other embodiments, other types of integrated circuits and components may be used.

Figure 3A:
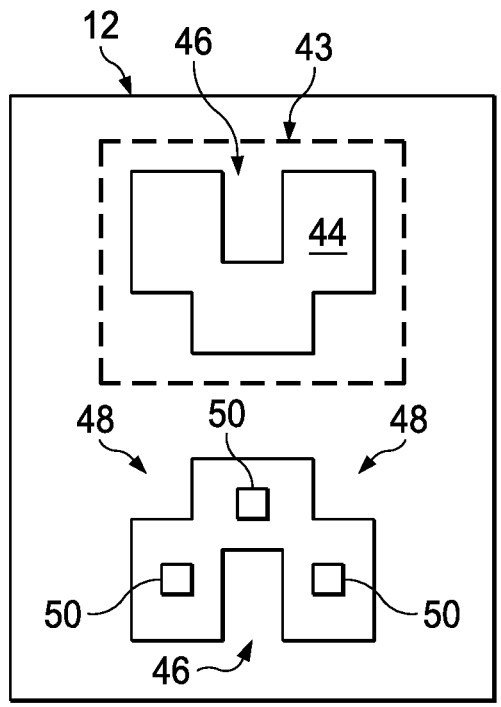
FIGS. 3A-3E depict a top view of a printed circuit board with an example of a solder pad geometry that supports multiple types of capacitors.
Figure 3B:
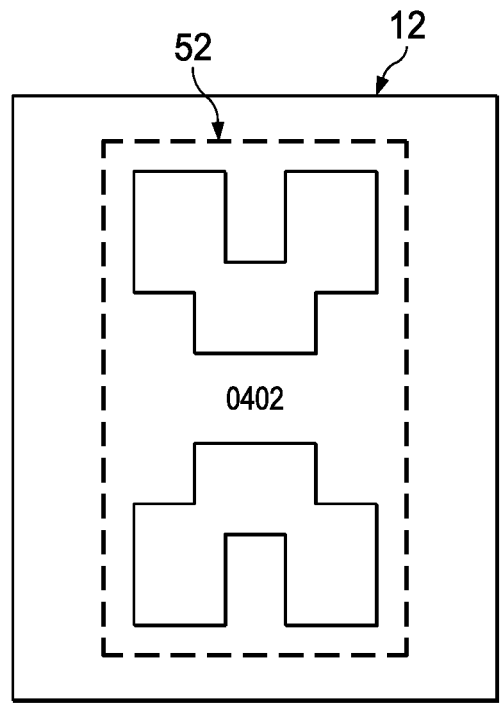
Figure 3C:
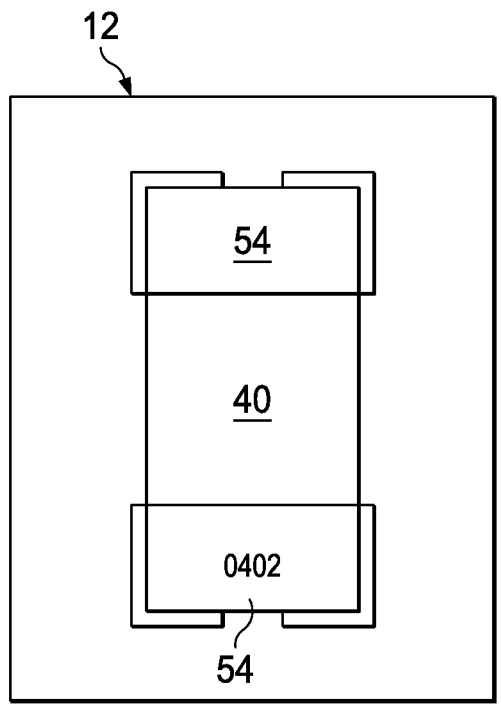

Referring now to FIGS. 3A-3E, a top view depicts a printed circuit board with an example of a solder pad geometry that supports multiple types of capacitors. FIG. 3A depicts a solder pad for a single capacitor that adapts to accept either a 0402 or 0201 capacitor coupled to opposing conductive areas 44. During manufacture, solder paste is applied at each conductive area 44 in a paste area 43 over top of a solder mask that substantially matches the shape of each conductive area 44. After solder paste is applied, a surface mount technology pick and place machine puts a component over top of conductive areas 44 and the solder paste is then heated to reflow the solder and couple the component to conductive areas 44 with an interface that communicates electrical signals. During solder reflow, solder paste turns to liquid and spreads across conductive areas 44. As depicted by FIG. 3B, each conductive area 44 has an area sized to accept the footprint 52 of a largest-sized expected component, in this example a 0402 capacitor 40, as illustrated in FIG. 3C. The 0402 capacitor 40 has opposing conductive areas that bind to melted solder paste during reflow to electrically couple with conductive areas 44.

In the example embodiment depicted by FIGS. 3A-3C, component 40 conductive areas 54 cover not just conductive areas 44 of printed circuit board 12 but also intervening conductive areas 46 and edge non-conductive areas 48 that are defined by the geometry of conductive areas 44. In the specific example, each conductive area 44 is built from three equal sized rectangle subareas 50 that overlap as shown. Since intervening nonconductive area 46 and edge nonconductive areas 48 do not receive solder paste due to the solder mask shape matching conductive area 44, less than all of the conductive areas 54 of large capacitor 40 couples to conductive area 44. However, including nonconductive areas within conductive area 44 aid in the proper placement of smaller components onto the same solder pads that support larger components.

Figure 3D:
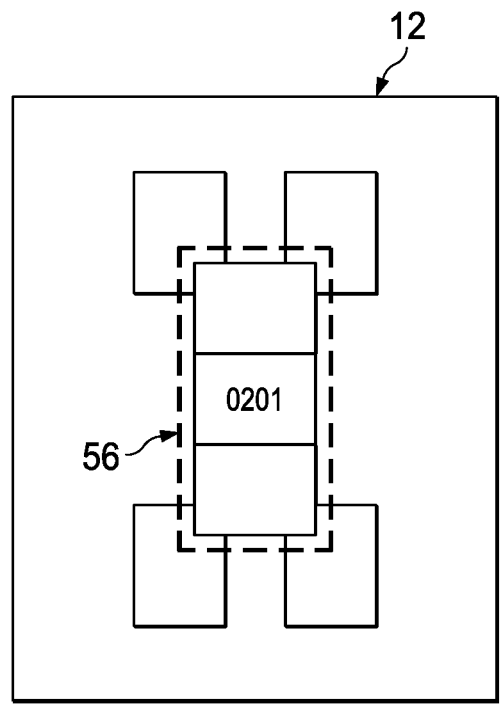
Figure 3E:
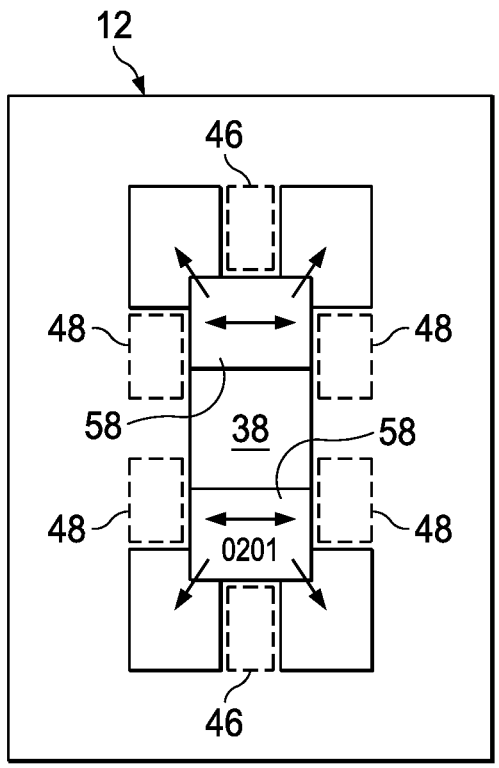

FIG. 3D depicts a small component footprint 56, such as that of a 0201 capacitor, which couples to conductive area 44 and stays in place during solder reflow. FIG. 3E depicts that small capacitor 38 has opposing conductive areas 58 that each couple to a conductive area 44. One risk during surface mount technology manufacture is that a component on melted solder paste can slide within a pool of liquid to shift out of position. The geometry of conductive area 44 prevents such sliding movement by interposing nonconductive and unsoldered areas between soldered areas where other larger components would fit. In the example embodiment of FIG. 3E intervening non-conductive areas 46 divide rectangle subareas 50 and act against longitudinal sliding motion of capacitor 38 by introducing friction against movement within the solder pool. Similarly, edge nonconductive areas 48 act against lateral sliding motion of capacitor 38. In this manner, the smaller capacitor 38 shares solder pads intended for larger capacitor 40 while ensuring that an intended component position is maintained during solder reflow.

Figure 4A:
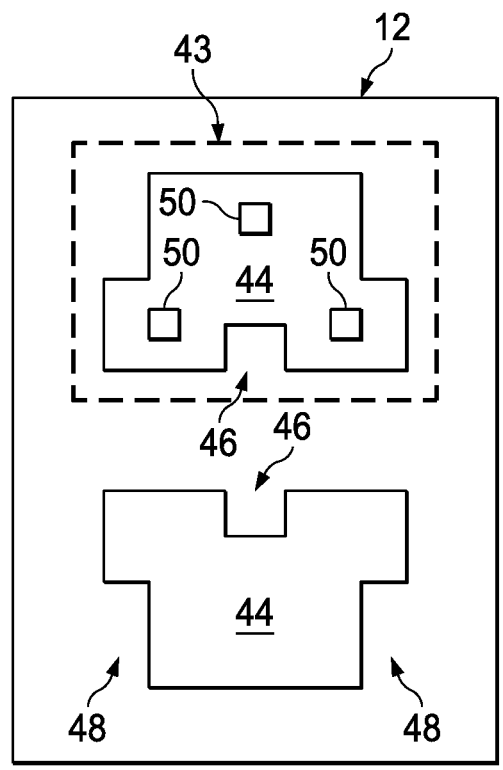
FIGS. 4A-4E depict a top view of a printed circuit board with an alternative example of a solder pad geometry that supports multiple types of capacitors.
Figure 4B:
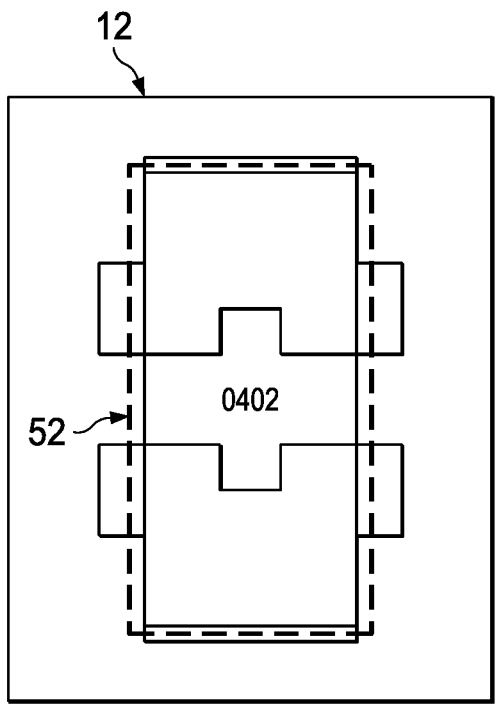
Figure 4C:
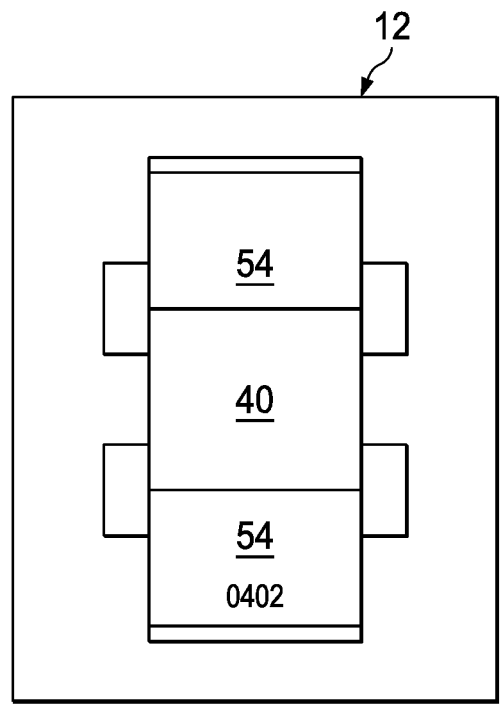

Referring now to FIGS. 4A-4E, a top view depicts a printed circuit board 12 with an alternative example of a solder pad geometry that supports multiple types of capacitors. In the example embodiment of FIG. 4A, a T-shape geometry of conductive areas 44 includes an intervening nonconductive area 46 disposed facing each other on opposing conductive areas 44 between two rectangle subareas 50. A central rectangle subarea 50 leaves edge nonconductive areas on opposing sides of conductive areas 44. As shown in FIG. 4B, a larger sized capacitor footprint 52 rests over intervening nonconductive areas 46 and along edge nonconductive areas 48. When mounted on conductive areas 44 as shown by FIG. 4C, the larger sized capacitor 40 leaves some excess conductive area 44 uncovered and covers over intervening nonconductive areas 46.

Figure 4D:
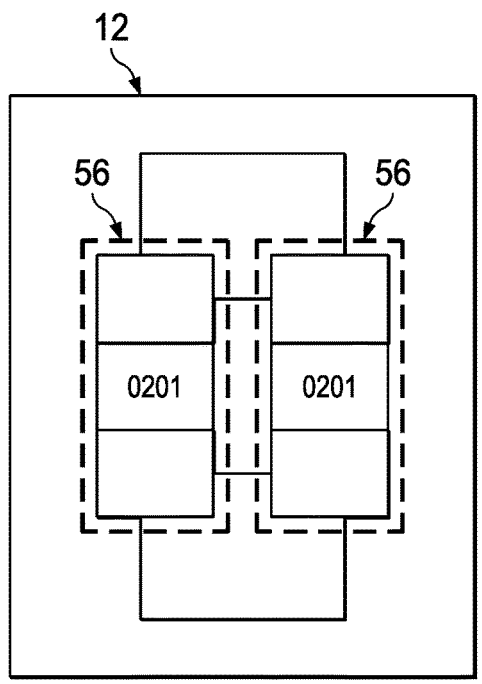
Figure 4E:
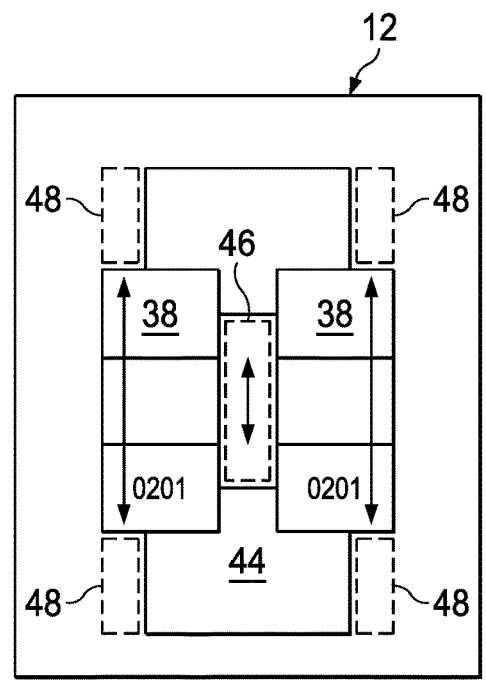

As shown in FIG. 4D, the two inner rectangle subareas 50 each provide a conductive surface to couple a separate smaller capacitor 38. FIG. 4E illustrates that two separate smaller capacitors 38 each couple to a set of opposing rectangle subareas 50. In the example embodiment, the two smaller 0201 capacitors may be used as a replacement for a single 0402 capacitor, such as when driven by costs or a parts shortage. Intervening nonconductive area 46 hold capacitors 38 separate during solder reflow by providing friction that works against lateral component movement. Edge nonconductive areas 48 hold capacitors 38 in position against longitudinal movement. In one alternative embodiment, intervening nonconductive area 46 may include some additional height, such as a build up of plastic material that further enhances separation of smaller capacitors 38 while having a small enough height that does not interfere with placement of larger capacitor 40.

Figure 5A:
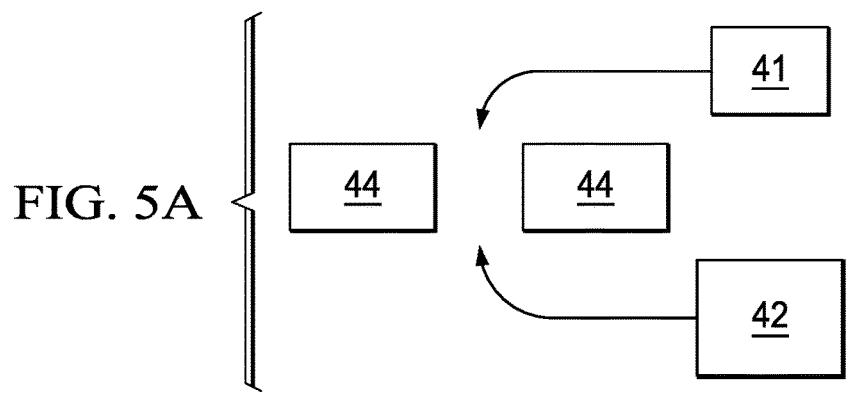
FIGS. 5A-5B depict a top view of a printed circuit board with an example of a solder pad geometry that supports multiple types of inductors.
Figure 5B:
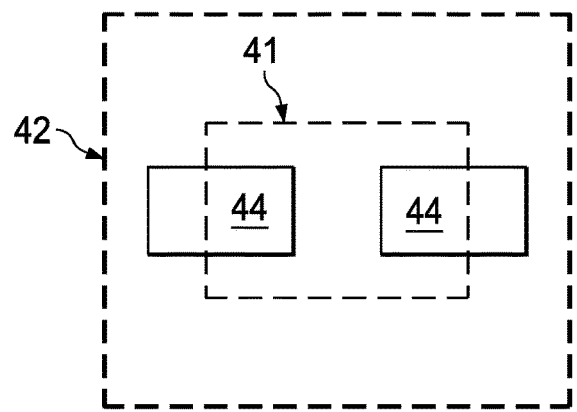

Referring now to FIGS. 5A-5B, a top view depicts a printed circuit board with an example of a solder pad geometry that supports multiple types of inductors. In the example embodiment conductive areas 44 are spaced so that a 10×10 mm inductor fits over both conductive areas 44. A smaller 7×7 mm inductor fits over conductive areas 44 without covering the entire area. Inductors 41 and 42 hold in position due to nonconductive areas that engage the components outside of conductive areas 44. In one example, nonconductive areas around conductive areas 44 may have a raised height. In another example embodiment, conductive areas 44 may include a break that defines the boundaries of allowed movement of smaller inductor 41.

Although the present invention has been described in detail, it should be understood that various changes, substitutions and alterations can be made hereto without departing from the spirit and scope of the invention as defined by the appended claims.

What is claimed is:

1. An information handling system comprising:
   a printed circuit board;
   a processor coupled to the printed circuit board and operable to executed instructions that process information;
   a memory coupled to the printed circuit board and interfaced with the processor, the memory operable to store the instructions and information;
   first and second supporting integrated circuits sized to couple to the printed circuit board at a first set of plural solder pads, the first set of plural solder pads matching a footprint of both the first supporting integrated circuit and the second supporting integrated circuit; and
   first and second supporting components sized to couple to the printed circuit board at a pair of supporting component solder pads placed to have spacing between each other, the first supporting component supporting operation of the first supporting integrated circuit, the second supporting component supporting operation of the second supporting integrated circuit;
   wherein the printed circuit board is built by a selection of the first supporting integrated circuit and the first supporting component or the selection of the second supporting integrated circuit and the second supporting component, the pair of supporting component solder pads have a footprint of less than the footprint of the first supporting component and that includes an intervening non-conductive portion defined between the pair to limit solder reflow when the second supporting component couples to the printed circuit board to support the second supporting integrated circuit, the second supporting component having a footprint that fits within a boundary defined by the intervening non-conductive portion.

2. The information handling system of claim 1 wherein the first and second supporting integrated circuits comprise first and second charger integrated circuits.

3. The information handling system of claim 2 wherein the first and second supporting components comprise charger integrated circuits.

4. The information handling system of claim 3 wherein the first and second supporting components comprise first and second chokes to manage power demand from the first and second charger integrated circuits.

5. The information handling system of claim 3 wherein the first supporting components comprise a 0402 capacitor and the second supporting components comprise one or more 0201 capacitors.

6. The information handling system of claim 1 wherein:
the first supporting component has a footprint of first and second opposing rectangles;
the first supporting solder pads have opposing conductive surfaces, each of the opposing conductive surfaces including the intervening non-conductive portion; and
the second supporting component has a footprint of first and second opposing rectangles smaller than the first supporting footprint, each intervening non-conductive portion impeding solder reflow at a boundary of the second supporting component.

7. The information handling system of claim 6 wherein the first supporting solder pads comprise first and second sets of three overlapping rectangle shapes each having a size of substantially the second supporting component footprint first and second opposing rectangles.

8. The information handling system of claim 7 wherein one of the three overlapping rectangle shapes on each of the first supporting solder pad sets extends towards the other set of three overlapping rectangle shapes.

9. The information handling system of claim 7 wherein two of the three overlapping rectangle shapes on each of the first supporting solder pads sets extends towards the other set of three overlapping rectangle shapes.

* * * * *